United States Patent [19]
Talaga, Jr. et al.

[11] Patent Number: 6,052,006
[45] Date of Patent: Apr. 18, 2000

[54] CURRENT MIRROR TRIGGERED POWER-ON-RESET CIRCUIT

[75] Inventors: Ronald F. Talaga, Jr., Austin, Tex.; Russell Hershbarger, Nevada City, Calif.

[73] Assignee: Advanced Micro Devices, Inc., Sunnyvale, Calif.

[21] Appl. No.: 09/085,444

[22] Filed: May 27, 1998

[51] Int. Cl.$^7$ .................................................. H03L 7/00
[52] U.S. Cl. ............................................................ 327/143
[58] Field of Search .................................. 327/142, 143, 327/198, 543

[56] References Cited

U.S. PATENT DOCUMENTS

| | | | |
|---|---|---|---|
| 4,717,840 | 1/1988 | Ouyang et al. | 307/594 |
| 4,939,385 | 7/1990 | Dubujet | 307/296.8 |
| 5,203,867 | 4/1993 | Love et al. | 307/272.2 |
| 5,517,144 | 5/1996 | Nakashima | 327/198 |
| 5,523,710 | 6/1996 | Miyake et al. | 327/198 |
| 5,703,510 | 12/1997 | Iketani et al. | 327/143 |

OTHER PUBLICATIONS

Horrowitz and Hill, "The Art of Electronics," Cambridge University Press, 1980, pp. 71–74 and 374.

*Primary Examiner*—Jeffrey Zweizig
*Attorney, Agent, or Firm*—Conley, Rose & Tayon; Robert C. Kowert

[57] ABSTRACT

The present disclosure encompasses the use of a current mirror to control the trip point for a power-on-reset circuit. The current mirror is designed to turn on at a multiple of a transistor threshold voltage $V_t$. The power-on-reset circuit asserts a power-on signal in response to mirror current provided by the current mirror when the supply voltage ramps up above the $V_t$ multiple. Since the transistor threshold voltage may be tightly controlled during the fabrication process, the trip point for the power-on-reset circuit may be precisely and accurately adjusted to match the minimum operating supply voltage level specified for an integrated circuit device such as a microprocessor. Also, a feedback path may be provided in the power-on-reset circuit to turn off the current mirror once the power-on signal is asserted so that there is no current draw in the power-on-circuit for static conditions. The lack of current draw at static power conditions prevents unnecessary power consumption and false stuck-at faults during $I_{ddq}$ testing.

25 Claims, 6 Drawing Sheets

CURRENT MIRROR TRIGGERED POWER-ON-RESET CIRCUIT

BACKGROUND OF THE INVENTION

1. Field of the Invention

This disclosure relates to power-on-reset circuits, and more particularly to a power-on-reset circuit employing a current mirror for a more precise trip point at low supply voltages. The power-on-reset circuit of the present invention may be part of an integrated circuit device such as a microprocessor.

2. Description of the Relevant Art

When power is first supplied to an electronic device, it is often desirable to hold the device in a reset state until the power supply is stable. Typically as a power supply ramps up, the voltage may fluctuate for a certain period of time until the power reaches a stable operating voltage. If an electronic device is not held in reset during this power ramp up period, the device will not perform correctly and could even be damaged. Typically a power-on-reset circuit is provided to hold the rest of the electronic device in a reset state until the power reaches a safe operating voltage. Typically a power-on-reset circuit provides a power-on signal, which may be the reset signal for an integrated circuit device, that indicates when the power supply has reached a safe minimum operating voltage. The power-on-reset circuit must keep the power-on signal unasserted until the supply voltage reaches the appropriate level. At that point, the power-on-reset circuit asserts the power-on signal to allow the integrated circuit device to begin operation. Therefore, the basic requirement for the power-on-reset circuit is to assure that the power-on signal is unasserted when the voltage is below the minimum safe operating voltage and is asserted when the voltage is above the minimum safe operating voltage. The design with an acceptable power-on-reset circuit is problematic, however, since typically the power-on-reset circuit is also powered by the same supply voltage that it is monitoring. The power-on-reset circuit must be able to appropriately drive the power-on signal as the supply voltage ramps up. Correct power-on-reset operation is especially important in an integrated circuit device such as a microprocessor. If the microprocessor begins operation before the power supply is stable, then the microprocessor may be damaged, cause data to be lost, or operate in an incorrect state.

FIG. 1 is a schematic diagram of a conventional power-on-reset circuit. PMOS transistors 14 and 16 are source-connected to supply voltage 10. The drains of PMOS transistors 14 and 16 are connected to the input of a first inverter 28. Resistor 18 is also connected to input node of inverter 28. The other end of resistor 18 is connected to ground node 12. Inverter 28 is connected in series with three more inverters, 30, 32 and 34. Thus, the output of inverter 28 is connected to the input of inverter 30, and the output of inverter 30 is connected to the input of inverter 32, and the output of inverter 32 is connected to the input of inverter 34. Inverter 34 outputs power-on signal 36. The gate of PMOS transistor 14 is connected to the drain of PMOS transistor 14 which is also connected to the input node for inverter 28. The gate of PMOS transistor 16 is connected to the output of inverter 28. The drain of NMOS transistor 20 is also connected to the input of inverter 28. The drains of NMOS transistors 22 and 24 are connected to the gate of NMOS transistor 20 and the sources of NMOS transistors 20, 22 and 24 are connected to ground node 12. The gate of NMOS transistor 22 is also connected to the gate of NMOS transistor 20 which is further connected to the drain of PMOS transistor 26. The source of PMOS transistor 26 is connected to the output of inverter 28 which is also connected to the gate of PMOS transistor 16. The gates of PMOS transistor 26 and NMOS transistor 24 are connected to the output of inverter 30.

The operation of the power-on-reset circuit of FIG. 1 is described as follows. PMOS transistor 14 begins to conduct current as supply voltage 10 ramps up above the threshold voltage of PMOS transistor 14. This current begins to charge the input node to inverter 28. When the supply voltage reaches a certain level, inverter 28 will flip and drive its output low. When inverter 28 flips to a low voltage, inverters 30, 32 and 34 will change state resulting in a power-on signal 36 being asserted. Also, PMOS transistor 16 will be turned on hard, pulling the input to inverter 28 up to approximately the full supply voltage. NMOS transistors 20, 22 and 24 and PMOS transistor 26 are configured to perform a Schmitt trigger function that delays the voltage input level at which inverter 28 changes state. Therefore, instead of changing state at approximately the supply voltage divided by two, inverter 28 will change state at a voltage level somewhat greater than that, such as ⅔ of the supply voltage. Therefore, as the supply voltage 10 ramps up, the power-on-reset circuit will assert the power-on signal when the voltage at the input node to inverter 28 reaches the trip point of inverter 28 as adjusted by the delay circuit comprised of NMOS transistors 20, 22, 24 and PMOS transistor 26.

For the power-on-reset circuit to operate correctly, there must be some margin between the voltage at which inverter 28 changes state, or flips, and the minimum operating voltage for the device. However, an ideal power-on-reset circuit will assert the power-on signal at the minimum operating voltage level for the device. Another problem for the power-on-reset circuit of FIG. 1 is that the trip point for the circuit is dependent upon the supply voltage level since the flip point for inverter 1 is dependent upon the supply voltage. The power-on-reset circuit is designed to function as a supply voltage is ramping up. Therefore, it is difficult to design a power-on-reset circuit to have a precise and accurate trip point since the trip point is a function of the supply voltage, which is changing in value. Ideally, a power-on-reset circuit should have a trip point that is precisely and accurately defined as approximately the minimum operating voltage for the device. Another problem with the power-on-reset circuit of FIG. 1 is that there is a constant current drain through PMOS transistor 16 and resistor 18 because PMOS transistor 16 remains turned on after power ramps up. This constant current flow through resistor R1 increases overall power consumption. Also, the current flow at static conditions through PMOS transistor 16 and resistor 18 may create problems for $I_{ddq}$ testing. The current flow may erroneously indicate a stuck at fault during $I_{ddq}$ testing.

Therefore, it is desirable to have a power-on-reset circuit that indicates when the supply voltage in an electronic device is at or above the minimum operating voltage for the device. It is further desirable that the trip point at which the power-on-reset circuit asserts the power-on signal to indicate that the supply voltage is at or above the minimum operating level be precisely and accurately located at the minimum operating voltage level. Furthermore, the power-on-reset circuit should have little or no power consumption by the current draw at static conditions. It is desirable that the power-on-reset circuit not indicate erroneous faults during testing such as $I_{ddq}$ testing.

SUMMARY OF THIS INVENTION

The above problems may be solved by a power-on-reset circuit with an accurate and precise trip point at approximately the minimum operating voltage for the device. Therefore, it is desirable to accurately assert a power-on signal when the supply voltage reaches the minimum operating voltage level even if the minimum operating voltage level is specified at a low voltage, such as 1.5 volts. One embodiment of the present invention also may provide a power-on-reset circuit with minimum current draw at static conditions. Therefore, the power-on-reset circuit may have virtually no power consumption at static conditions and does not interfere with $I_{ddq}$ testing.

The power-on-reset circuit may achieve a more precise and accurate trip point by a design that trips at a voltage based off of transistor threshold voltages instead of the supply voltage. This provides a more accurate and precise trip point because the transistor threshold voltage is set at a relatively stable level whereas during power ramp up the supply voltage is constantly changing. A current mirror or current mirrors are used to provide current to charge a capacitor at the input of an inverter output stage that drives the power-on signal. The current mirror stage has a precise trip point derived at a multiple of the transistor threshold voltage so that the capacitor is not charged until this voltage level is reached. The transistor threshold voltage may be adjusted during the fabrication process so that the trip point for the power-on-reset circuit may be precisely at or near the minimum operating supply voltage level.

Broadly speaking, a power-on-reset circuit is provided for indicating when the supply voltage provided by a power supply to an electronic device is at least at a minimum operating level. The power-on-reset circuit includes a current mirror stage that is coupled to the power supply. The current mirror stage provides a mirror current to a capacitor when the supply voltage is approximately at the minimum operating level. An output stage is coupled to the capacitor. The output stage asserts a power-on signal when the capacitor is charged by the mirror current above the threshold voltage for the output stage. The output stage unasserts the power-on signal when the capacitor is charged below the output stage threshold voltage. The current mirror stage does not provide the mirror current when the supply voltage is approximately below the minimum operating level. When the supply voltage ramps up to approximately above the minimum operating level, the current mirror begins to provide the mirror current. Once the power-on signal is asserted, the current mirror is shut off and no longer conducts current. The current mirror may comprise transistors and may begin to provide the mirror current when the supply voltage is approximately twice the transistor threshold voltage, where the transistor threshold voltage is set during the fabrication process so that the minimum operating level is approximately twice the transistor threshold voltage. Alternatively, the trip point for the current mirror stage may be set at any multiple of transistor threshold voltages corresponding to the minimum operating voltage level.

The current mirror stage may include a first current mirror and a second current mirror coupled together. The second current mirror is adapted to mirror the current from the first current mirror. The second current mirror provides the mirror current output. The mirror current output may be an exact mirror of the program current in the first current mirror, or may be proportional to that current as a function of the transistor sizings in the two current mirrors. In one embodiment of the present invention, the first current mirror may include PMOS transistors. The PMOS transistors may be source-substrate connected. Alternatively, the current mirrors may comprise NMOS transistors, bi-polar transistors or any other such device suitable for current mirror operation. In the embodiment where the first current mirror comprises PMOS transistors, the second current mirror may comprise NMOS transistors. The first current mirror or the entire current mirror stage may comprise a Wilson current mirror. Generally, the current mirror stage may include at least two gate-coupled transistors where the mirror current is proportional to the size ratio of the gate-coupled transistors. In the embodiment including a first current mirror and a second current mirror, each current mirror may comprise at least two gate-coupled transistors. The mirror current output from the second current mirror may be proportional to the size ratio of the gate-coupled transistors of the first current mirror times the size ratio of the gate-transistors of the second current mirror.

The output stage of the power-on-reset circuit may comprise one or more inverters. The input of the first inverter is coupled to the capacitor. The power-on signal is asserted by the series connected one or more inverters when the capacitor at the input of the first inverter is charged to the threshold voltage of the inverter. The output stage may also include a pull-up device, such as a transistor connected between the input of the first inverter and the supply voltage. When the power-on signal is asserted, the pull-up device will turn on and pull the input to the first inverter up to approximately the full supply voltage.

The current mirror stage may also include a switch circuit. In the embodiment comprising a first and second current mirror, the switch circuit may be coupled to the second current mirror and to the capacitor. The switch circuit is also connected to the supply voltage and opens in response to the mirror current. When the current mirror stage provides the mirror current, the switch opens to conduct current to the capacitor, thereby charging the capacitor and flipping the output stage to assert the power-on signal. The capacitor may not be charged directly by the current mirror but by current provided through the switch circuit. The switch circuit may include a resistor and a switch transistor, both coupled to the supply voltage. When the mirror current is sunk through the resistor, the voltage drop across the resistor turns on the switch transistor to conduct current to charge the capacitor. The switch transistor will turn on when the voltage drop across the resistor is approximately greater than or equal to the threshold voltage of the switch transistor. The switch circuit may also include a diode that is coupled to the switch transistor to counter leakage current from the switch transistor when the switch circuit is off to prevent early charging of the capacitor.

The power-on-reset circuit may be implemented discretely or may be included in an integrated circuit device. The power-on-reset circuit provides the power-on signal to indicate when the supply voltage is at the minimum operating level for correct operation of the integrated circuit device. The integrated circuit device may include a microprocessor core so that the power-on-reset circuit provides a power-on signal to the microprocessor core.

Broadly speaking, one embodiment of the present invention may contemplate a circuit comprising a first current mirror coupled to a supply voltage. A second current mirror is coupled to the first current mirror and is configured to mirror in the first current mirror. A switch is coupled to the second current mirror and controlled by current in the second current mirror. A capacitor is coupled to the switch and is configured to be charged by current from the switch when the switch is on. An output stage is coupled to the capacitor and is configured to assert a power-on signal. The first current mirror may comprise transistors and may be configured to conduct current when the supply voltage is at a trigger voltage that is proportional to the transistor threshold voltage. Furthermore, the switch may be adapted so that it turns on when the supply voltage is approximately at this trigger voltage. When the supply voltage is greater than or equal to approximately the trigger voltage, the capacitor charges and the output stage asserts the power-on signal. The output stage unasserts the power-on signal when the supply voltage is below approximately the trigger voltage. The trigger voltage is proportional to transistor threshold voltage and may be two times the transistor threshold voltage. Once the power-on signal is asserted, the first and second current mirrors and the switch are turned off and do not conduct current Also, the output stage may include a feedback circuit for charging the capacitor after the power-on signal is asserted.

An embodiment of the present invention may also contemplate a method for generating a power-on signal for indicating when a supply voltage is at least at a minimum operating level. The method includes providing a program current as the supply voltage begins to ramp up and mirroring the program current when the supply voltage reaches a voltage proportional to a transistor threshold voltage to provide a mirror current. The method further includes charging a capacitance in response to the mirror current and asserting a power-on signal in response to the capacitance charging. The method may further include turning off the program current and the mirror current in response to the assertion of the power-on signal. The method may also include unasserting the power-on signal when the supply voltage drops below the minimum operating level for more than a transitory period of time.

BRIEF DESCRIPTION OF THE DRAWINGS

Other aspects of the invention will become apparent upon reading the following detailed description and upon reference to the accompanying drawings in which.

Figure 1:
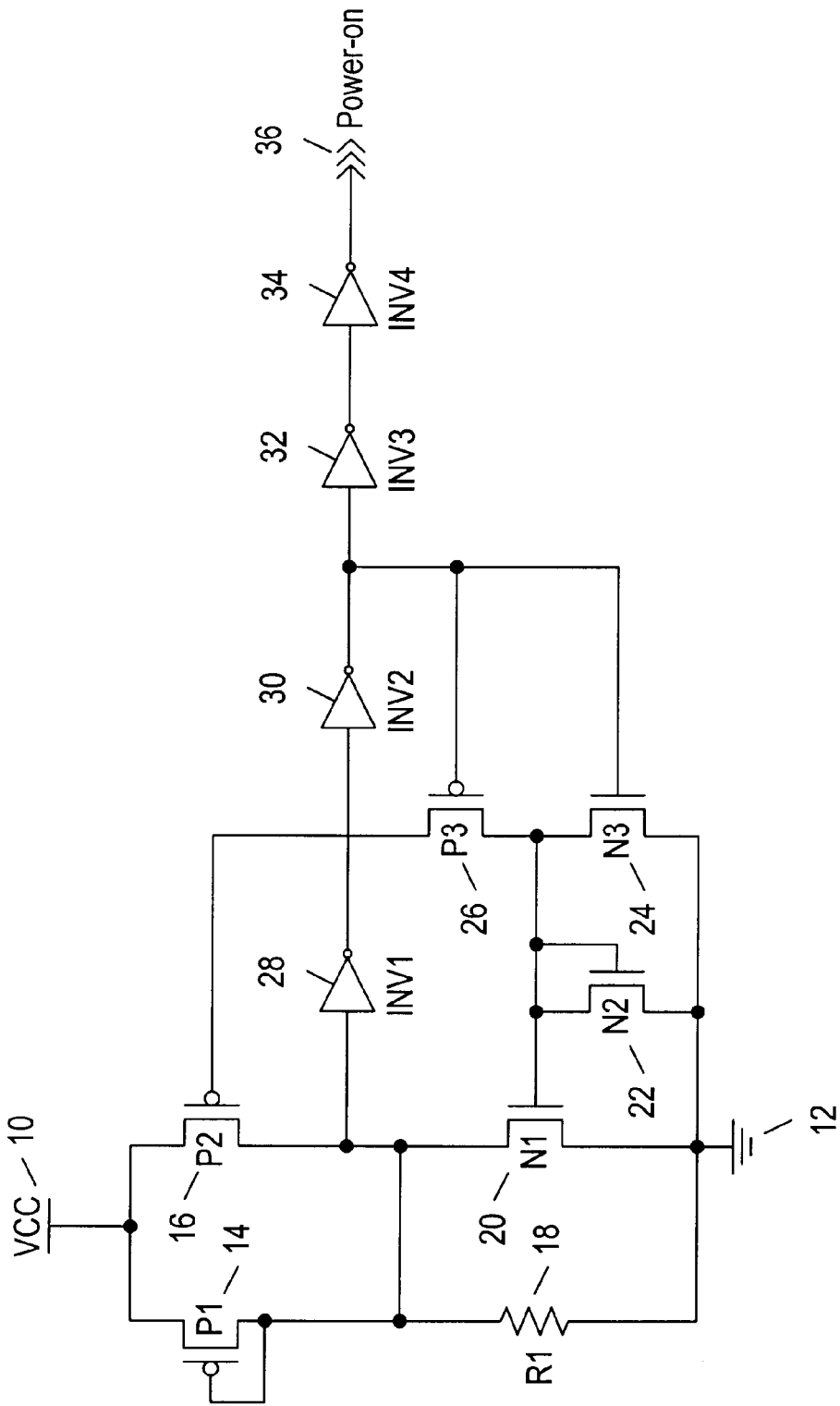
FIG. 1 is a schematic diagram illustration of a conventional power-on-reset circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
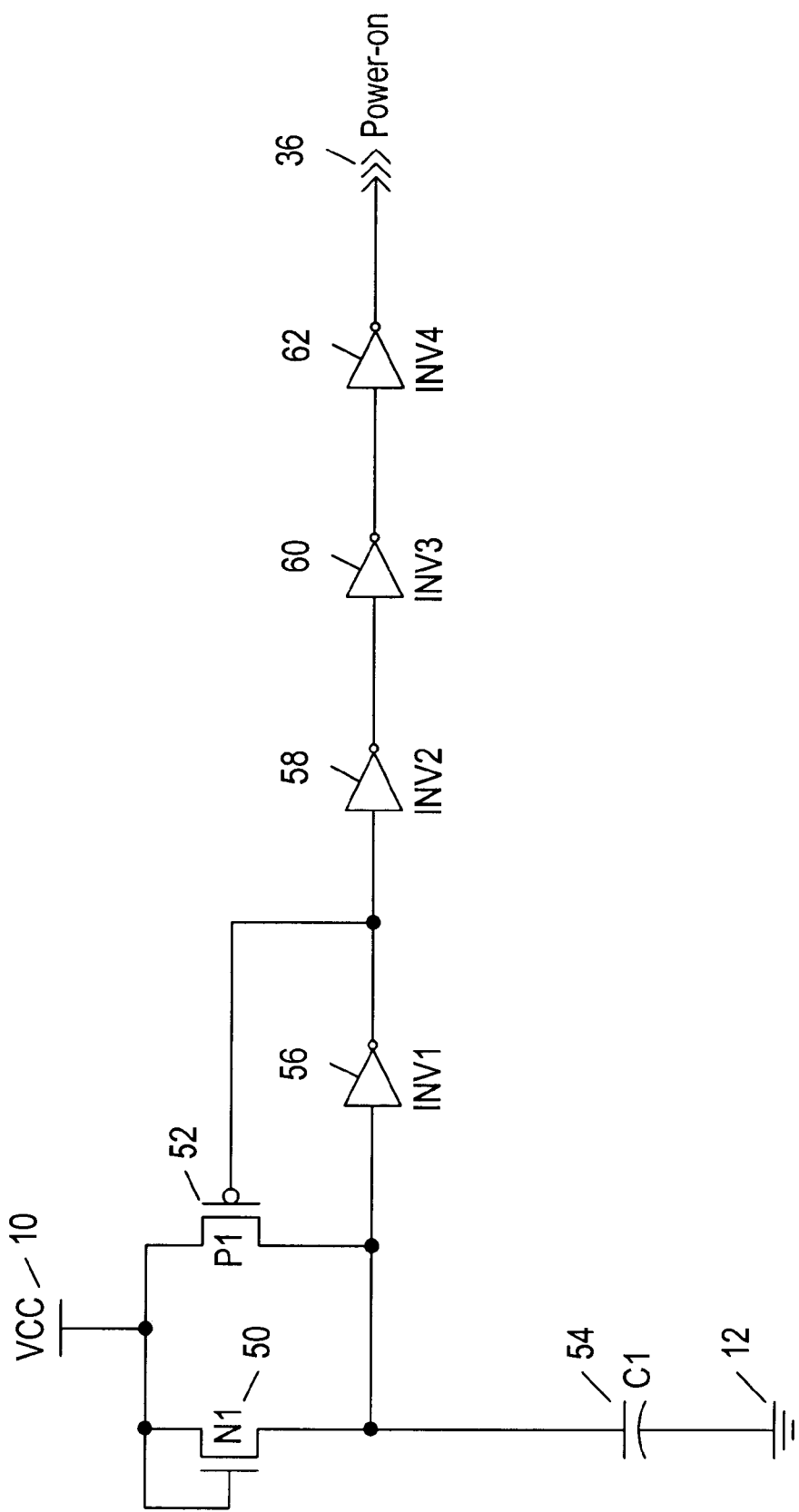
FIG. 2 is a schematic diagram of a diode-capacitor power-on-reset-circuit.

Turning now to FIG. 2, a schematic diagram of a power-on-reset circuit is illustrated. The power-on-reset circuit includes an NMOS transistor 50, with its gate and drain coupled to the supply voltage 11 and its source coupled to capacitor 54. The other side of capacitor 54 is coupled to ground node 12. Capacitor 54 and the source of NMOS transistor 50 are also coupled to the input of inverter 56. The output of inverter 56 is coupled to the input of inverter 58, whose output is coupled to the input of inverter 60, whose output is coupled to input of inverter 62, whose output drives the power-on signal 36. A PMOS transistor 52 is also coupled between supply voltage 10 and the input of inverter 56. The gate of PMOS transistor 32 is connected to the output of inverter 56.

NMOS transistor 50 functions as a diode, charging capacitor 54 as the supply voltage 10 ramps up. When the supply voltage 10 reaches the flip point for inverter 56, approximately the supply voltage divided by two, then inverter 56 changes state and inverters 58, 60 and 62 change state, thus asserting power-on signal 36. Also, when inverter 56 changes state, the feedback connected to PMOS transistor 52 turns on PMOS transistor 52, pulling up the input to inverter 56 to approximately the full supply voltage 10.

The power-on-reset circuit of FIG. 2 is a somewhat similar circuit to that of FIG. 1, however, the circuit in FIG. 2 also has drawbacks. For example, the trip point for this power-on-reset circuit is also based on the supply voltage. Therefore, the circuit of FIG. 2 suffers similar problems as described for the circuit of FIG. 1. Because of variations in process fabrication conditions, it is very difficult to make the trip point for the power-on-reset circuit of FIG. 2 to be accurate. For example, if the N devices in the inverter chain 56–62 are faster than their P devices, the power-on signal may be asserted before the supply voltage is at the minimum operating voltage for other PMOS devices in the integrated circuit device. Alternatively, process variations can cause the circuit to trip too slowly so that power-on signal 36 will be asserted out of step, i.e., when the supply voltage is significantly above the minimum operating level. In order for the power-on-reset circuit of FIG. 2 to operate correcting for a wide range of possible supply voltages and minimum operating voltage level specifications, the process fabrication conditions, would have to be controlled more tightly than is feasible.

Figure 3:
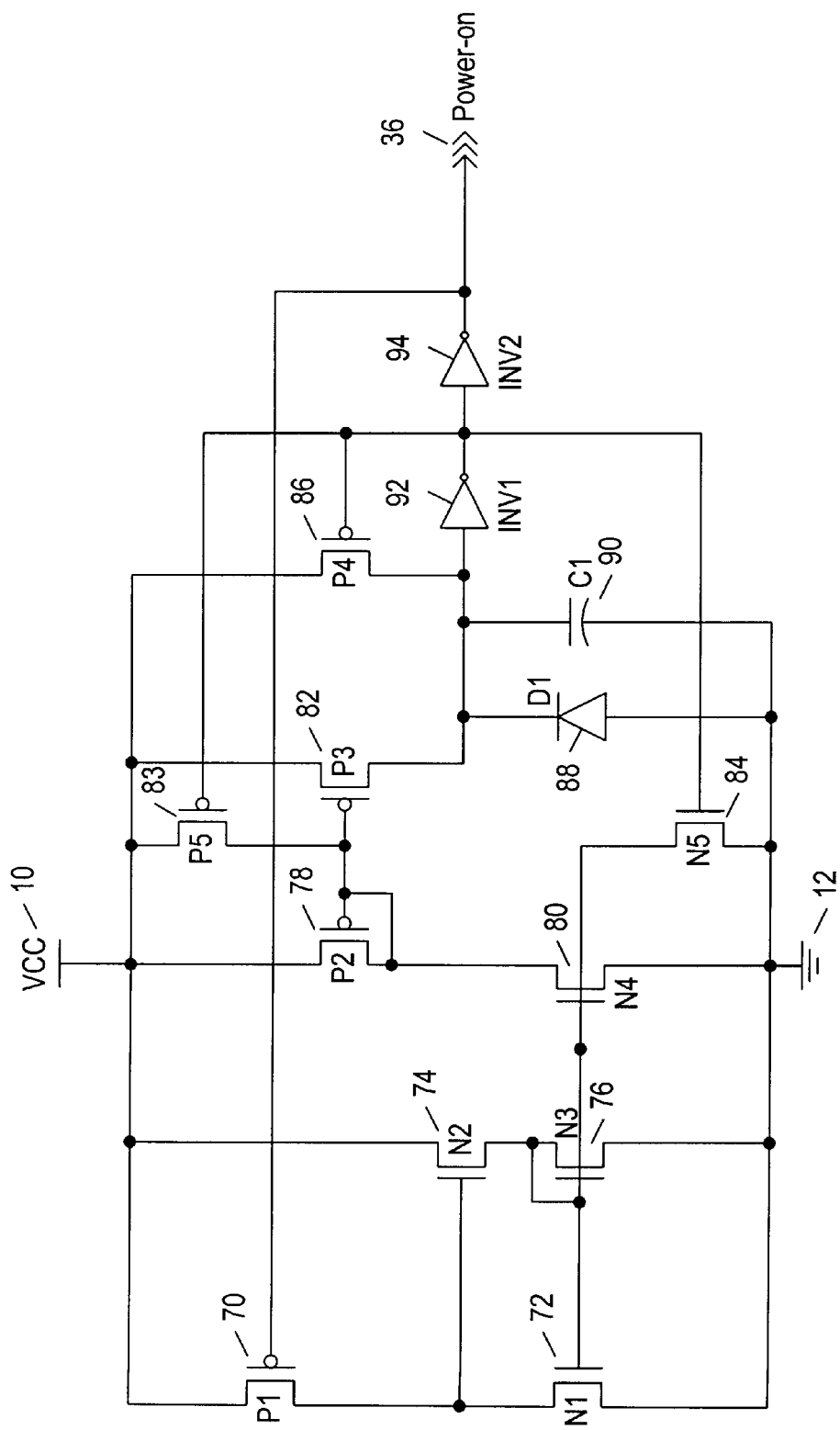
FIG. 3 is a schematic diagram of a power-on-reset circuit employing a current mirror to charge a capacitor to flip an inverter output stage that drives a power-on signal for indicating when the supply voltage is at the minimum operating voltage level.

Turning now to FIG. 3, a schematic diagram of a power-on-reset circuit that overcomes many of the problems as discussed above is illustrated. The circuit includes NMOS transistors 72, 74, 76 and 80, which form a Wilson current mirror and PMOS transistors 78 and 82 that form a second current mirror. The drain of NMOS transistor 72 is coupled to the drain of a PMOS transistor 70, whose source is coupled to supply voltage 10. NMOS transistor 74 has its drain coupled to supply voltage 10 and its source coupled to the drain of NMOS transistor 76. The gate of the NMOS transistor 74 is coupled to the drain of NMOS transistor 72, and the gates of NMOS transistor 72, 76 and 80 are connected together and connected to the drain of NMOS transistor 76. The sources of NMOS transistors 72, 76 and 80 are all connected to ground node 12. Also, the drain of NMOS transistor 84 is connected to the gates of NMOS transistor 72, 76 and 80. The source of NMOS transistor 84 is connected to the ground node 12.

For the PMOS current mirror, PMOS transistors 78 and 82 are source coupled to the supply voltage 10. The gates of PMOS transistors 78 and 82 are connected together and to the drains of PMOS transistors 78 and 83. The drain of PMOS transistor 78 is also connected to the drain of NMOS transistor 80. The source of PMOS transistor 83 is connected to supply voltage 10. Capacitor 90 is coupled between the drain of PMOS transistor 82 and the ground node 12. Also, a diode 88 has its cathode connected to the drain of PMOS transistor 82 and its anode connected to the ground node 12. The drain of PMOS transistor 82, the cathode of diode 88 and the capacitor 90 are also all connected to the input of inverter 92. Also, the drain of PMOS transistor 86 is connected to the input of inverter 92 and the source of PMOS transistor 86 is connected to supply voltage 10. The output of inverter 92 is connected to the input of inverter 94 and also drives the gates of PMOS transistors 83 and 86 and NMOS transistor 84. The output of inverter 94 drives the power-on signal 36, and also drives the gate of PMOS transistor 70.

The power-on-reset circuit of FIG. 3 operates as follows. As the supply voltage 10 begins to ramp up, current will begin to flow through PMOS transistor 70 and NMOS transistor 72. When the supply voltage reaches $2V_t$, i.e., the threshold voltage for NMOS transistor 74 plus the threshold for NMOS transistor 76, the NMOS Wilson current mirror will turn on and the current through NMOS transistor 72 will be mirrored through NMOS transistors 74, 76 and 80. If AMOS transistors 72 and 80 are sized exactly the same, the current through NMOS transistor 80 will be approximately equal to that through NMOS transistor 72. However, NMOS transistor 80 may be sized differently from NMOS transistor 72 so that the current through NMOS transistor 80 will be proportional to the size ratio of NMOS transistor 80 to NMOS transistor 72. The PMOS current mirror of PMOS transistors 78 and 82 will mirror the current in NMOS transistor 80 through PMOS transistor 82. Again, the current through PMOS transistor 82 will be proportional to the size ratio of the transistors. The mirror current through PMOS transistors 82 will charge capacitor 90. When capacitor 90 is charged to a voltage above the trip point for inverter 92, the inverters 92 and 94 will change state and assert power-on signal 36. Thus, when capacitor 90 is charged above the trip point, or threshold, for inverter 92, the output of inverter 92 will be driven to a low voltage and the output of inverter 94 will be driven to a high voltage, thus asserting a power-on signal 36. The output of inverter 92 is fed back to the gate of PMOS transistor 86, thus turning on PMOS transistor 86 to pull the input of inverter 92 up to approximately the full supply voltage. The output of inverter 92 is also fed back to the gate of PMOS transistor 83. Also, the output of inverter 94 is fed back to the gate of PMOS transistor 70. Thus, when the power-on signal is asserted, PMOS transistors 70 and 83 will shut off the current flow in the current mirrors. NMOS transistor 84 functions to keep the current mirrors turned off when the power-on signal 36 is unasserted. Therefore, there is little or no current flow in the power-on-reset circuit of FIG. 3 for static conditions. Therefore, the power-on-reset circuit of FIG. 3 will not interfere will $I_{ddq}$ testing.

The power-on-reset circuit of FIG. 3 provides a much more precise and accurate trip point for asserting the power-on signal than do the power-on-reset circuits of FIGS. 1 and 2. This accuracy and precision is achieved by using the Wilson current mirror of NMOS transistor 72, 74 and 76 that turns on at a voltage based on the transistor threshold voltage. The transistor threshold voltage may be controlled much more accurately during the fabrication process than inverter transistor sizings for the power-on-reset circuits of FIGS. 1 and 2. The transistor threshold voltages for NMOS transistor 74 and 76 may be adjusted during fabrication so that $2V_t$ is approximately equal to the minimum operating voltage level for the integrated circuit device. Thus, the trip point for the power-on-reset circuit of FIG. 3 can be adjusted during fabrication to closely match the minimum operating voltage level. Alternatively, one or more additional NMOS transistors can be added in series with NMOS transistors 74 and 76 so that the trip point for the power-on-reset circuit could be set at any multiple of transistor threshold voltages. For example, another NMOS transistor could be placed in series between NMOS transistor 76 and ground node 12 so that the trip point for the power-on-reset circuit would be approximately $3V_t$.

While the power-on-reset circuit of FIG. 3 provides a much more precise and accurate trip point that can be closely matched to the minimum operating voltage level for even low voltages, the circuit still suffers a few drawbacks. For example, as the supply voltage 10 ramps up, PMOS transistor 78 and the PMOS current mirror may be slightly on when the supply voltage reaches a voltage above its threshold voltage. Some current may flow through PMOS transistor 78 and be mirrored in PMOS transistor 82, this current may begin to charge capacitor 90 and cause inverters 92 and 94 to change state and thus assert power-on signal 6 early before the supply voltage 10 has reached the minimum operating level. At worst case, the circuit could trip at a supply voltage slightly above the transistor threshold voltage for PMOS transistor 78. Another problem may cause the power-on-reset circuit of FIG. 3 to assert power-on signal 36 too late, i.e., when supply voltage 10 is somewhat above the minimum operating level. This problem occurs because in the typical process, NMOS transistor 74 cannot be source-substrate connected. Therefore, NMOS transistor 74 may have a source-base voltage above 0V, which causes the threshold voltage to rise due to the body effect. Instead of turning on at $2V_t$, the NMOS current mirror will turn on somewhat above $2V_t$ due to the body effect in NMOS transistor 74. Therefore, the body effect problem in NMOS transistor 74 and the early turn on of PMOS transistor 78 may cause the trip point for the power-on-reset circuit of FIG. 3 to be either too high or too low, respectively.

Figure 4:
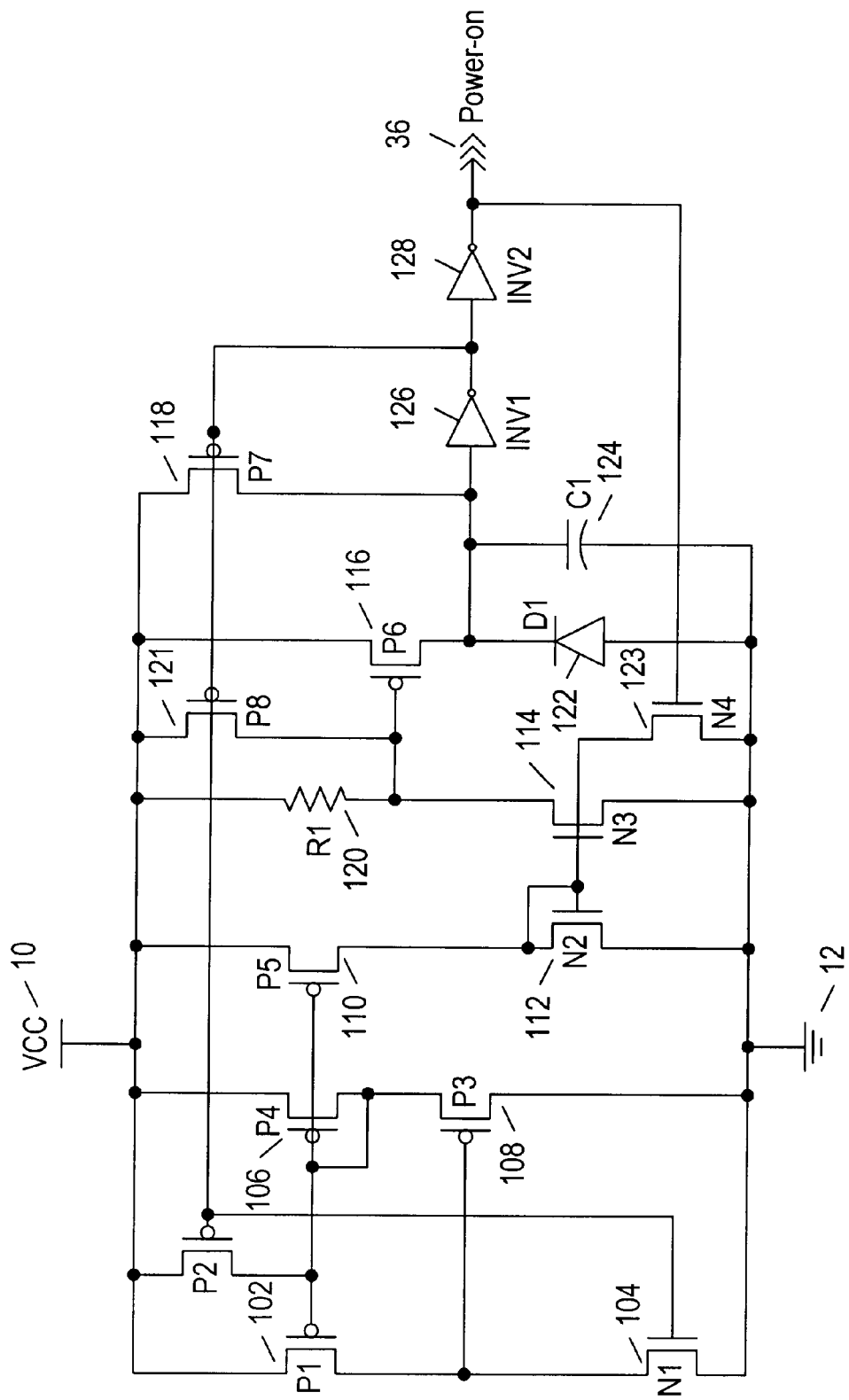
FIG. 4 is a schematic diagram of a power-on-reset circuit employing a current mirror and a switch circuit to charge a capacitor to flip an inverter output stage that drives a power-on signal for indicating when the supply voltage is at the minimum operating voltage level.

Turning now to FIG. 4, a schematic diagram of a preferred embodiment is illustrated. The transistor types of the current mirrors are reversed from those in FIG. 3. The first stage Wilson current mirror is now comprised of PMOS transistors and the second current mirror stage has NMOS transistors. PMOS transistors 102, 106, 108 and 110 form a PMOS Wilson current mirror. PMOS transistors 102, 106 and 110 are source connected to supply voltage 10 and have the gates coupled together. The gates of PMOS transistors 102, 106 and 110 are also connected to the drain of PMOS transistor 106 which is also connected to the source of PMOS transistor 108. The drain of PMOS transistor 108 is connected to ground node 12. The drain of PMOS transistor 102 is connected to the drain of NMOS transistor 104, whose source is connected to ground node 12. The gate of PMOS transistor 108 is connected to the drain of PMOS transistor 102. A PMOS transistor 100 is connected between the gates of PMOS transistors 102, 106, 110 and the supply voltage 10.

The NMOS current mirror is coupled to the PMOS current mirror by the drain of NMOS transistor 112 being connected to the drain of PMOS transistor 110. The gates of NMOS transistors 112 and 114 are connected together and to the drains of NMOS transistors 112 and 123. The sources of NMOS transistors 112, 114 and 123 are connected to ground node 12. A resistor 120 is connected between supply voltage 10 and the drain of NMOS transistor 114. A PMOS transistor 116 has its gate connected to the drain of NMOS transistor 114 and to the drain of PMOS transistor 121. The sources of PMOS transistors 116 and 121 are connected to supply voltage 10 and the drain of PMOS transistor 116 is connected to the cathode of diode 122 and capacitor 124 and to the input to inverter 126. The anode of diode 122 and capacitor 124 are connected to ground node 12. PMOS transistor 118 is connected between supply voltage 10 and input to inverter 126. The output of inverted 126 drives input of inverter 128 whose output drives power-on signal 36. The output of inverter 126 also drives the gates of PMOS transistors 118, 121 and 100 and the gate of NMOS transistor 104. The output of inverter 128 also drives the gate of NMOS transistor 123.

The operation of the power-on-reset circuit of FIG. 4 is described as follows. As a supply voltage 10 ramps up, current begins flowing through NMOS transistor 104. Once the supply voltage is above $2V_t$s, the NMOS Wilson current mirror stage turns on and current flows in the current mirror. Thus, when a supply voltage is above the threshold voltage of PMOS transistor 106 plus the threshold voltage of PMOS transistor 108, those two devices will turn on and the current in PMOS transistor 102 will be mirrored in PMOS transistor 110. The NMOS current mirror of NMOS transistors 112 and 114 will mirror the current in PMOS transistor 110 through NMOS transistor 114. This will create a voltage drop across resistor 120 turning on PMOS transistor 116. When PMOS transistor 116 turns on, it will conduct current to charge capacitor 124. Diode 122 is configured to counter leakage current through PMOS transistor 116 when PMOS transistor 116 is off, to prevent early charging of capacitor 124. Once PMOS transistor 116 has been turned on by the voltage drop across transistor 120 and capacitor 124 has charged above the flip point for inverter 126, inverters 126 and 128 will change state and assert power-on signal 36. The output of inverter 126 is fed back to turn on pull up transistor 118, thus pulling the input to inverter 126 the rest of the way up to supply voltage 10. The output of inverter 120 is also fed back to PMOS transistors 100 and 121 and NMOS transistor 104 to shut off the current mirrors and shut off PMOS transistor 116 when power-on signal 36 is asserted. Since there is little or no current draw in the power-on-reset circuit of FIG. 4 for static conditions, $I_{ddq}$ testing is not interfered with.

The power-on-reset circuit of FIG. 4 avoids the problems discussed above for the power-on-reset circuit of FIG. 3. Resistor 120 and PMOS transistor 116 act as a switch circuit to prevent early charging of capacitor 124. While there is no current flowing through the current mirrors, resistor 120 keeps the gate of PMOS transistor 116 pulled up to the supply voltage level keeping PMOS transistor 116 off. Also, diode 122 counters any leakage current through PMOS transistor 116. Therefore, capacitor 124 will not be charged to any significant extent until the current mirrors turn on at approximately $2V_t$. Once the current mirrors turn on and current begins to flow through resistor 120, PMOS transistor 116 will turn on as soon as the voltage drop across resistor 120 equals the threshold voltage for PMOS transistor 116. The current in the current mirrors is proportional to the sizing of the transistors. Therefore, to turn on the switch transistor 116, the current through transistor 104 times the size ratio of PMOS transistor 110 to PMOS transistor 102 times the size ratio of NMOS transistor 114 to NMOS transistor 112 times the resistance value of resistor 120 must be greater than the threshold voltage for PMOS transistor 116.

The size of PMOS transistor 116 and capacitor 124 determine the time it takes for the input node to inverter 126 to charge above the inverter trip point once PMOS transistor 116 has been turned on by the voltage drop across resistor 120. Note that diode 122 must be sized to counter the leakage current through PMOS transistor 116 when the transistor is off but not so large that it swamps the current through PMOS transistor 116 when the transistor is on.

Also, the body effect problem described for the power-on-reset circuit of FIG. 3 is avoided in the power-on-reset circuit of FIG. 4 because in a typical CMOS process the PMOS transistors 106 and 108 may be source substrate connected. Therefore, the turn on point for the current mirrors can be set at exactly $2V_t$. Or alternatively, any multiple of $V_t$ by adding more PMOS transistors in series with PMOS transistors 106 and 108. Therefore, by adjusting the PMOS transistor threshold voltage level, the transistor sizings, and the values of resistor 120 and capacitor 124, the trip point for the power-on-reset circuit of FIG. 4 may be precisely and accurately adjusted to be at the minimum operating level for an integrated circuit device as desired. Capacitor 124, once charged, also serves to keep the power-on signal 36 asserted during brief, transitory supply voltage glitches that dip the supply voltage 10 below the flip point for inverters 126 and 128.

Figure 5:
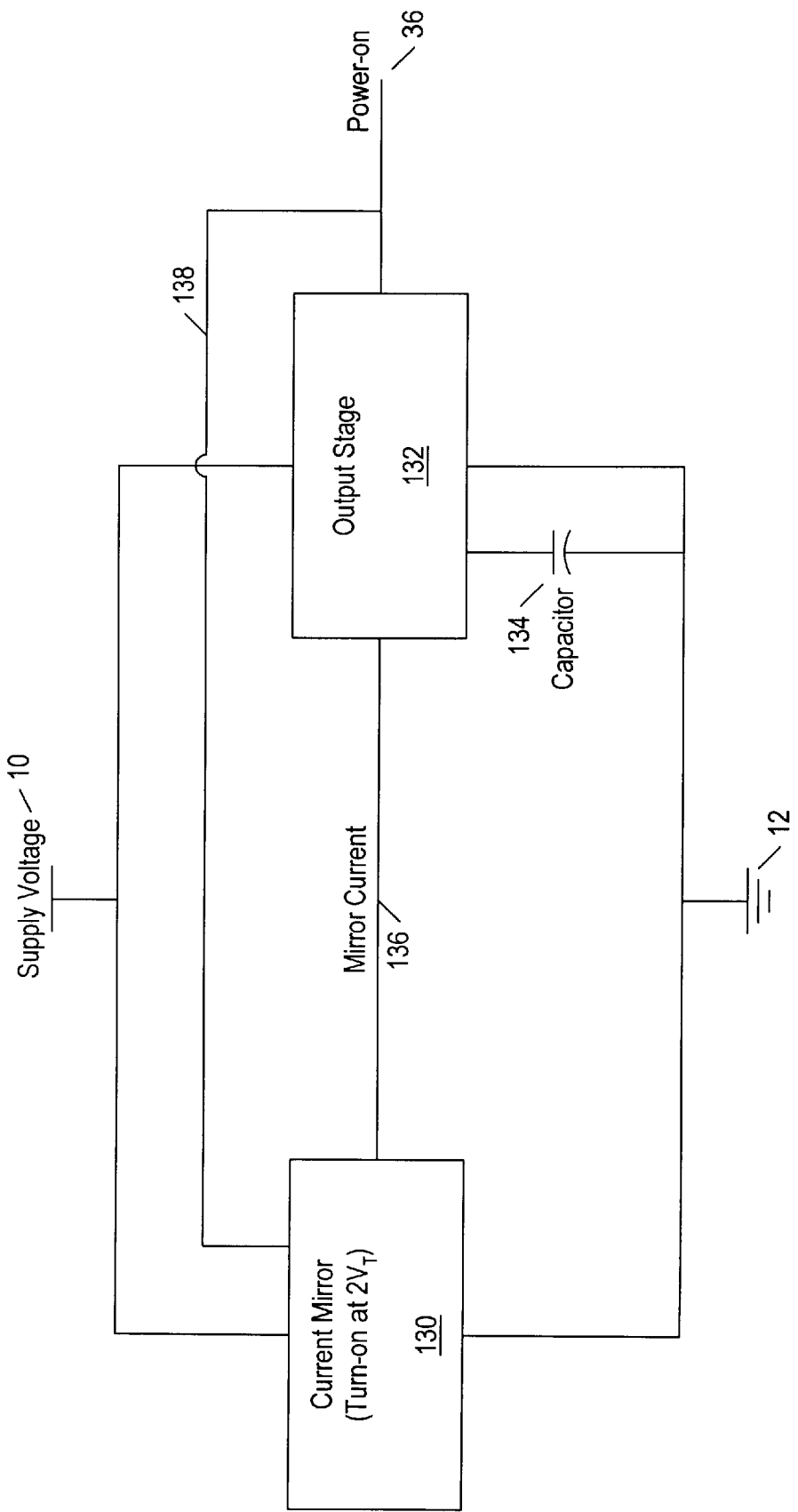
FIG. 5 is a block diagram illustration of a power-on-reset circuit employing a current mirror to charge a capacitor to flip an output stage that drives a power-on signal for indicating when the supply voltage is at the minimum operating voltage level.

Turning now to FIG. 5, a general block diagram is illustrated. A current mirror 130 is coupled between the supply voltage 10 and ground node 12. The current mirror 130 outputs a mirror current 136 to output stage 132. A capacitor 134 is coupled between the output stage 132 and ground node 12. Output stage 132 drives power-on signal 36. The output of output stage 132 is also fed back to the current mirror 130. Current mirror 130 turns on when supply voltage 110 ramps up to $2V_t$ or, alternatively, any other $V_t$ multiple. When current mirror 130 turns on, it provides mirror current to output stage 132. The mirror current may directly charge capacitor 134 or a switch circuit may be provided in output stage 132 that turns on responsive to the mirror current and thus begins to charge capacitor 134. When capacitor 134 is charged to a voltage equal to the threshold voltage for output stage 132, power-on signal 36 is asserted. The feedback path 138 to current mirror 130 causes current mirror 130 to turn off so that there is no current draw once power-on signal 36 is asserted.

Current mirror 130 may be a single current mirror or may include two or more current mirror stages. For example, current mirror 130 may comprise an NMOS Wilson current mirror as a first stage coupled to a PMOS current mirror as a second stage, as in the power-on-reset circuit of FIG. 3. Alternatively, current mirror 130 may include a PMOS Wilson current mirror for the first stage and an NMOS current mirror for the second stage as in the power-on-reset circuit of FIG. 4. Different types of current mirror circuits and different numbers of stages may be utilized for current mirror 130. The key aspect of current mirror 130 is that its turn on point is derived from transistor threshold voltage levels which may be tightly controlled during the fabrication process thus providing a precise and accurate turn-on point for the power-on-reset circuit. Output stage 132 may include one or more series connected inverters for driving power-on-reset circuit 136, such as inverters 92 and 94 in FIG. 3, and inverters 126 and 128 in FIG. 4. Output stage 132 may also include a diode connected across capacitor 134 and/or a switch circuit to prevent early charging of capacitor 134. The switch circuit may operate responsive to the mirror current such that current is not switched on to charge capacitor 134 until the mirror current reaches a certain level. Resistor 120 and PMOS transistor 116 of FIG. 4 are an example of such a switch circuit. Capacitor 134 may be constructed from any suitable process for creating an integrated capacitor and may be the capacitance associated with a device such as the input transistors for one of the inverters in the output stage.

Feedback path 138 may include one or more pull up devices such as PMOS transistor 86 in FIG. 3 and PMOS transistor 118 in FIG. 4 that serve to pull up the input to the inverter chain when the power-on signal 36 is asserted. Feedback path 138 may also include devices to turn off current mirror 130 when power-on signal 36 is asserted. Transistors 70, 83 and 84 in FIG. 3 and transistors 100, 104, 121 and 123 in FIG. 4 are examples of devices controlled by a feedback path that served to turn off the current path when power-on signal 36 is asserted. By using a current mirror to control when the power-on signal 36 is asserted, the power-on-reset circuit of FIG. 5 is able to provide a much more precise and accurate turn-on point for the power-on-reset circuit. Since the current mirror may be designed to turn on at a multiple of transistor threshold voltages, and transistor threshold voltages may be tightly controlled during the fabrication process, the power-on-reset circuit of FIG. 5 may be designed so that power-on signal 36 is asserted very closely to the minimum operating voltage level intended for the integrated circuit device for which the power-on-reset circuit supplies power-on signal 36, even if the minimum operating voltage level is very low. Also, feedback path 138 allows the power-on-reset circuit current flow to be shut off at static conditions, thus conserving power and preventing any current drain that may interfere with $I_{ddq}$ or other testing.

Figure 6:
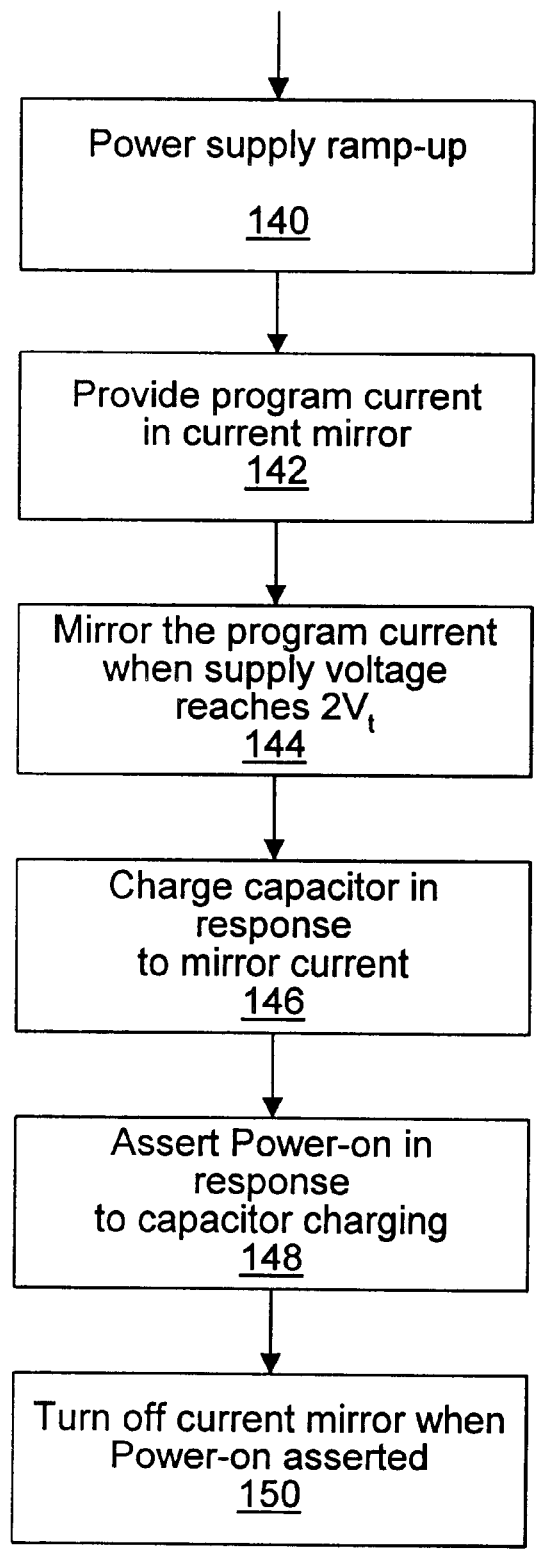
FIG. 6 is a flow chart illustrating a method for generating a power-on signal for indicating when a supply voltage is at least at a minimum operating level.

Turning now to FIG. 6, a flow chart illustrating a method for generating a power-on signal for indicating when a supply voltage is at least at a minimum operating level is illustrated. The method begins with the power supply voltage ramping up as indicated at 140. A program current is provided in a current mirror as indicated at 142 as the power supply voltage begins to ramp up. The program current is mirrored in a current mirror to provide a mirror current when the supply voltage reaches a voltage proportional to a transistor threshold voltage as indicated at 144. For example, a mirror current may be provided when the supply voltage reaches $2V_t$. A capacitance is charged in response to the mirror current as indicated at 146. A power-on signal is asserted, as indicated at 148, in response to the charging of the capacitor and, when the power-on signal is asserted, the program current in the current mirror is turned off as indicated at 150. This method provides a precise and accurate turn-on point for a power-on signal because the turn-on point for the power-on signal is determined according to a transistor threshold voltage which may be precisely and accurately controlled.

The power-on-reset circuits of FIGS. 2 through 5 and the method of FIG. 6 may be implemented discretely to provide a power-on-reset circuit to any electronic system or may be implemented as part of an integrated circuit device such as a microprocessor. By using a current mirror to set the trip point for the power-on-reset circuit, a more precise and accurate trip point may be achieved to more closely match a specified minimum operating voltage level.

It will be appreciated to those skilled in the art having the benefit of this disclosure that embodiments of this invention may be appropriate for applications with numerous types of numerous semiconductor processes for creating integrated circuits and in discrete systems. Furthermore, it is to be understood that the form of the invention shown and described is to be taken as presently preferred embodiments. Various modifications and changes may be made to each and every element as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A power-on-reset circuit for indicating when the supply voltage provided by a power supply is at least at a minimum operating level, comprising a current mirror stage coupled to the power supply and adapted to provide a mirror current when the supply voltage is approximately at the minimum operating level, wherein said current mirror stage comprises a first current mirror and a second current mirror, wherein said second current mirror is adapted to mirror the current in said first current mirror to provide said mirror current;

a capacitor coupled to said current mirror stage and adapted to be charged in response to said mirror current; and an output stage coupled to said capacitor, wherein said output stage asserts a power-on signal when said capacitor is charged above an output stage threshold voltage and unasserts said power-on signal when said capacitor is charged below the output stage threshold voltage.

2. The power-on-reset circuit as recited in claim 1, wherein said current mirror stage does not provide said mirror current when the supply voltage is approximately below the minimum operating level.

3. The power-on-reset circuit as recited in claim 1, wherein said current mirror stage conducts substantially no current when said power-on signal is asserted.

4. The power-on-reset circuit as recited in claim 1, wherein said current mirror stage comprises transistors, wherein said current mirror stage provides said mirror current when the supply voltage is approximately twice the transistor threshold voltage, wherein the minimum operating level is approximately twice the transistor threshold voltage.

5. The power-on-reset circuit as recited in claim 1, wherein said current mirror stage further comprises a switch circuit coupled to said second current mirror and said capacitor, wherein said switch circuit is adapted to charge said capacitor in response to said mirror current.

6. The power-on-reset circuit as recited in claim 5, wherein said switch circuit includes a resistor and a switch transistor both coupled to the supply voltage, wherein said second current mirror is adapted to sink said mirror current through said resistor, wherein said switch transistor provides current to charge said capacitor when the voltage drop across said resistor is approximately greater than or equal to the threshold voltage of said switch transistor.

7. The power-on-reset circuit as recited in claim 5, wherein said switch circuit includes a diode coupled to said switch circuit and configured to prevent early charging of said capacitor by countering leakage current from said switch circuit when said switch circuit is off.

8. The power-on-reset circuit as recited in claim 1, wherein said first current mirror comprises PMOS transistors.

9. The integrated circuit device as recited in claim 8, wherein said PMOS transistors are body-source connected.

10. The power-on-reset circuit as recited in claim 1, wherein said first current mirror comprises a Wilson current mirror.

11. The power-on-reset circuit as recited in claim 1, wherein said current mirror stage comprises at least two gate-coupled transistors, wherein said mirror current is proportional to the size ratio of said gate-coupled transistors.

12. The power-on-reset circuit as recited in claim 1, wherein said first current mirror and said second current mirror each comprise at least two gate-coupled transistors, wherein said mirror current is proportional to the size ratio of the gate-coupled transistors of said first current mirror times the size ratio of the gate-coupled transistors of said second current mirror.

13. The power-on-reset circuit as recited in claim 1, wherein said output stage comprises an inverter, wherein the input of said inverter is coupled to said capacitor, and wherein said output stage threshold voltage is the threshold voltage of said inverter.

14. The power-on-reset circuit as recited in claim 13, wherein said output stage further includes a pull-up device configured to charge said capacitor to approximately the supply voltage when said power-on signal is asserted.

15. The power-on-reset circuit of claim 1, wherein the power-on-reset circuit is comprised in an integrated circuit.

16. The power-on-reset circuit as recited in claim 1, wherein said power-on signal is provided to a microprocessor core.

17. A circuit, comprising a first current mirror coupled to a supply voltage;

a second current mirror coupled to said first current mirror for mirroring current in said first current mirror;

a switch coupled to said second current mirror and controlled by current in said second current mirror;

a capacitor coupled to said switch and adapted to be charged by current from said switch when said switch is on; and an output stage coupled to said capacitor for asserting a power-on signal.

18. The circuit as recited in claim 17, wherein said first current mirror comprises transistors and is adapted to conduct current when the supply voltage is at a trigger voltage, wherein said trigger voltage is proportional to the transistor threshold voltage.

19. The circuit as recited in claim 18, wherein said switch turns on when the supply voltage is approximately at said trigger voltage.

20. The circuit as recited in claim 19, wherein said capacitor charges and said output stage asserts said power-on signal when the supply voltage is greater than or equal to approximately the trigger voltage and unasserts said power-on signal when the supply voltage is below approximately the trigger voltage.

21. The circuit as recited in claim 20, wherein said trigger voltage is approximately two times the transistor threshold voltage.

22. The circuit as recited in claim 17, wherein said first and second current mirrors and said switch do not conduct significant current after said power-on signal is asserted.

23. The circuit as recited in claim 22, wherein said output stage includes a feedback circuit adapted to charge said capacitor after said power-on signal is asserted.

24. A method for generating a power-on signal for indicating when a supply voltage is at least at a minimum operating level, comprising providing a program current as the supply voltage begins to ramp up;

mirroring said program current when the supply voltage reaches a voltage proportional to a transistor threshold voltage to provide a second mirror current, wherein said mirroring comprises mirroring said program current in a first current mirror and mirroring a first mirror current in said first current mirror to provide said second mirror current;

charging a capacitance in response to said second mirror current; and asserting a power-on signal in response to said charging.

25. The method as recited in claim 24, further comprising turning off said program current and said mirror current in response to said asserting.

* * * * *